Sept. 30, 1969 W. D. WAGNER ET AL 3,470,483

MINIATURE MICROWAVE BROADBAND DETECTOR DEVICES

Filed March 21, 1966 2 Sheets-Sheet 1

INVENTORS
WALTER D. WAGNER
PHILIP E. KING
ERNEST CALOCCIA
ROBERT ROBBINS
BY [signature]
ATTORNEY Sept. 30, 1969 W. D. WAGNER ET AL 3,470,483

MINIATURE MICROWAVE BROADBAND DETECTOR DEVICES

Filed March 21, 1966 2 Sheets-Sheet 2

INVENTORS

WALTER D. WAGNER
PHILIP E. KING
ERNEST CALOCCIA
ROBERT ROBBINS

BY [signature]
ATTORNEY

United States Patent Office 3,470,483
Patented Sept. 30, 1969

3,470,483

MINIATURE MICROWAVE BROADBAND DETECTOR DEVICES

Walter D. Wagner, Philip E. King, Ernest Calocccia, and Robert Robbins, Nashua, N.H., assignors to Sanders Associates, Inc., Nashua, N.H., a corporation of Delaware Filed Mar. 21, 1966, Ser. No. 535,961
Int. Cl. H03d 9/02
U.S. Cl. 329—160 8 Claims

ABSTRACT OF THE DISCLOSURE

A mircrowave detector circuit having impedance matching transformers on the input signal side of the detector diode, which transformer transforms the relatively low impedance of the transmission line to the high input impedance of the diode, thereby providing relatively uniform signal detection over a wide range of operating frequencies.

This invention relates to crystal diode microwave mixers and detectors. It also relates to a new strip transmission line construction for such circuits, as well as for microwave circuits in general which employ lumped circuit components, particularly semiconductor components. More particularly, the invention provides highly compact microwave mixers and detectors that have uniformly high performance over their operating bandwidths.

The performance of a crystal mixer is usually expressed in terms of conversion loss, which is the ratio of the modulated R.F. power applied to the mixer to the usuable I.F. power output from it. The input R.F. impedance of the mixer and its output I.F. impedance are two factors that determine the conversion loss. Frequency-stable, matched impedances increase the absorption of input R.F. power by the mixer and increase the transfer of output I.F. power to the mixer load. Hence, they contribute to a low conversion loss. A low noise figure, which measures the noise introduced to the I.F. signal in the mixer, is also important for high performance.

An important performance factor of a crystal detector is tangential signal sensitivity, which is the amount of applied R.F. signal power, below a reference level, required to produce an output pulse of sufficient amplitude to raise the noise fluctuation to above the average level of the noise. It generally becomes increasingly difficult to attain a high tangential sensitivity as the bandwidth is increased.

A uniform matched R.F. input impedance is also required for high detector performance, as is a uniform matched output impedance over the bandwidth of the output signal. Other measures of detector performance are rise time and isolation of radio frequency power from the detector output terminals.

Another important specification for detectors and mixers is "flatness" that is, the attainment of uniform performance with input signals of widely different power levels. A detector, for example, should develop an output power that changes linearly in accordance with changes in the R.F. input power.

Many prior crystal diode detectors and mixers employ resonant, mechanically tunable, cavities and transmission line stubs to match the diode impedances to the source and to the load. Such arrangements are relatively bulky. Also, they often require transmission line interconnections between the diode and the cavities and stubs, thereby introducing unwanted reactances, particularly capacitive loading.

Further, the matching impedance are often in parallel with the diode. This shunt arrangement bypasses some of the input R.F. power to ground so that it is not applied to the diode.

Other crystal mixers and detectors constructed according to prior techniques employ resistive elements to obtain the desired impedance characteristics and to provide D.C. return paths. However, resistances dissipate power and hence generally decrease sensitivity.

Mode transformers, i.e. structures that change the mode of energy propagation, are also used in detectors and mixers. But they also generally result in decreased sensitivity and often are relatively frequency sensitive.

The present invention reduces the size and mechanical complexity of these prior mixers and detectors. Further, it provides mixers and detectors having measurably improved electrical performance and lower cost.

Another aspect of the invention is that the strip transmission line construction of the illustrated detector is suited for constructing essentially all kinds of microwave circuits that incorporate lumped circuit components. It provides both mechanically secure support for the circuit components and eletrically reliable radio frequency connections throughout the circuit. Yet, it does not require precise mechanical tolerances or costly manufacturing operations. Moreover, the clamped R.F. contacts in the present strip transmission line circuits are less sensitive to temperature effects than in many prior conventional constructions, and the new circuit construction readily seals moisture from the inner conductor elements.

Conventional strip transmission line devices incorporating lumped components generally have a rigid dielectric support for the inner conductor; the inner conductor is often a "printed" circuit element on a dielectric board that is cut away where the lumped component is inserted. The transmission line outer conductor is a metal plate or a conductive layer on a printed circuit board. This arrangement of relatively stiff layers is not very well suited for receiving additional elements such as the lead of a component between two layers unless a groove or like space is provided to receive the lead.

An object of the present invention is to provide improved microwave devices employing lumped components. A further object is to provide such devices having small size and relatively simple mechanical construction.

It is also an object to provide such devices having improved electrical performance as compared with prior art devices.

A more particular object of the invention is to provide microwave diode detectors and mixers that are highly compact, having small size and light weight.

A further object of the invention is to provide microwave diode detectors and mixers that have a relatively close impedance match, over a broad frequency band, between the diode and the input and output circuits connected to it.

Another object of the invention is to provide a compact detector having a high, frequency stable, tangential signal sensitivity relative to the bandwidth of the detected signal. It is also an object to provide such a detector in which the ratio of the amplitude of the detected signal to the amplitude of the input R.F. signal is relatively uniform over a wide range of input signal levels.

It is also an object of the invention to provide a compact mixer having a low conversion loss and a small noise figure for a given operating bandwith.

A further object of the invention is to provide an improved construction for strip transmission line circuits employing lumped components and particularly semiconductor components. More particularly, it is an object to provide such strip transmission line structures that provide mechanically secure support, particularly under shock and vibration conditions, for the lumped components without requiring precise mechanical tolerances. A further object is that the transmission line structures mental conditions, particularly shock, vibration and also provide reliable R.F. contacts under adverse environmental conditions, particularly shock, vibration and temperature change.

Another object of the invention is to provide strip transmission line constructions of the foregoing type that provide a moisture seal for the inner conductor elements. Also, it is desired that the circuits be highly compact and suited for relatively low cost manufacture.

Other objects of the invention will in part be obvious and will in part appear hereinafter.

The invention accordingly comprises the features of construction, combinations of elements, and arrangement of parts which will be exemplified in the constructions hereinafter set forth, and the scope of the invention will be indicated in the claims.

For a fuller understanding of the nature and objects of the invention, reference should be had to the following description taken in connection with the accompanying drawings, in which.

In a video detector embodying the invention, a high-pass transmission line filter and a transmission line impedance transformer match the diode to the source of the modulated R.F. input signal. A low-pass filter transfers the output signal from the diode to subsequent circuits, typically a video amplifier, for processing the video signal (i.e. modulation of the R.F. signal). The detector employs only transmission lines that propagate R.F. energy in the TEM mode. Moreover, it is highly compact, being free of bulky resonant cavities and stubs.

The input high-pass filter blocks direct currents and low frequency carriers from the diode. It also shunts noise voltages to ground. In addition, the input filter provides a path to ground for the rectified signal produced in the detection process. Direct current bias applied to the diode also returns to ground through this path.

The impedance transformer transforms the relatively low impedance of the input line to near the high impedance level of the diode. It appears that the optimum impedance match is achieved when the impedance transformer is between the input filter and the diode, i.e. when it is contiguous with the transmission line section in which the diode is mounted.

The low-pass filter between the diode and the detector output terminal provides high R.F. isolation without materially degrading the video rise time, which is important for detecting short pulses with high fidelity.

Although the invention is described below with particular reference to a video detector, the transmission line circuit is also well-suited for other diode detectors as well as for microwave diode mixers. Further, the strip line construction of the detector can advantageously be used in constructing other strip line devices employing lumped components.

Figures 2, 3:
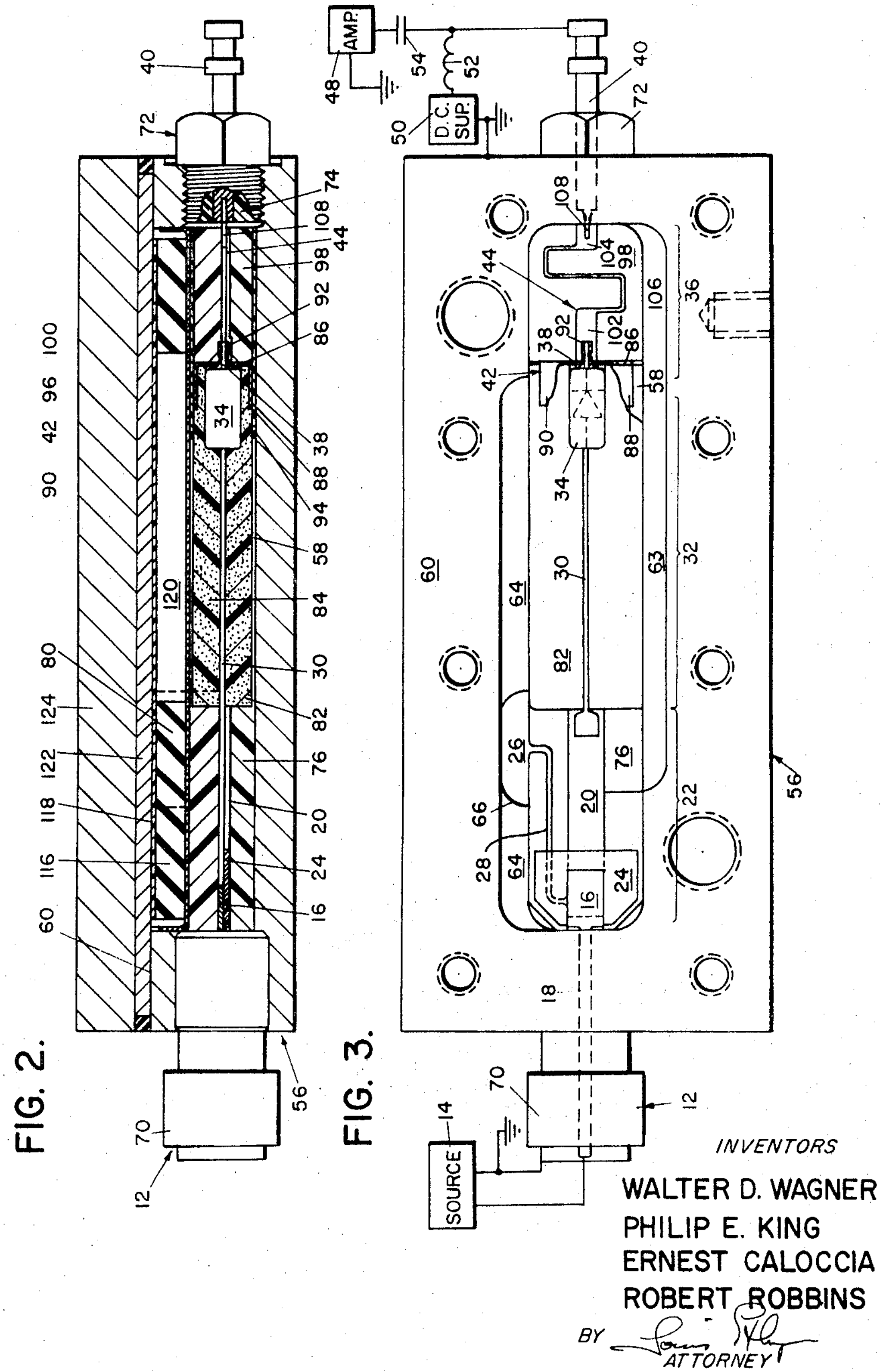
FIGURE 2 is a longitudinal cross section of the assembled detector of FIGURE 1.
FIGURE 3 is a top plan view of a partly assembled detector showing the inner conductor elements. The drawing also shows schematically external input and output circuits connected to the detector.

More particularly, FIGURE 3 shows the inner conductor arrangement of a strip transmission line video detector embodying the invention. From a coaxial connector 12, the modulated R.F. signal from a source 14 is applied to a high-pass filter 22 having an inner conductor plate 16 connected to the connector inner conductor 18. The plate 16 extends over the end of a strip transmission line inner conductor 20 and an insulating sheet 24, suitably of mica, is disposed between the overlapping plate 16 and the inner conductor 20. The plate 16 and conductor 20 thus form an input capacitor between the connector 12 and the rest of the detector.

A branch conductor 28 in the filter 22 extends from the inner conductor 20 to a tab conductor 26 that is connected as described below to the strip line outer conductor.

At the end of the filter 22 remote from the input capacitor, the inner conductor 20 connects to a considerably narrower inner conductor 30 of an impedance transformer 32. The other end of the inner conductor 30 connects to the anode of a diode 34; the illustrated detector employs the diode anode lead for the inner conductor 30.

The cathode lead 38 of the diode connects to a low-pass filter 36, the other end of which connects to a video output terminal 40. The principal elements of the low-pass filter 36 are the R.F. bypass capacitor formed by a channel member 42 and the R.F. inductance of a folded inner conductor 44.

From the terminal 40, the video output signal passes to a video amplifier 48. A direct voltage supply 50 also connects to the terminal 40 to provide bias for the diode 34. A choke 52 in series with the supply and a capacitor 54 in series with the amplifier input respectively block the video signal from the supply and block the bias current from the video amplifier.

Figure 1:
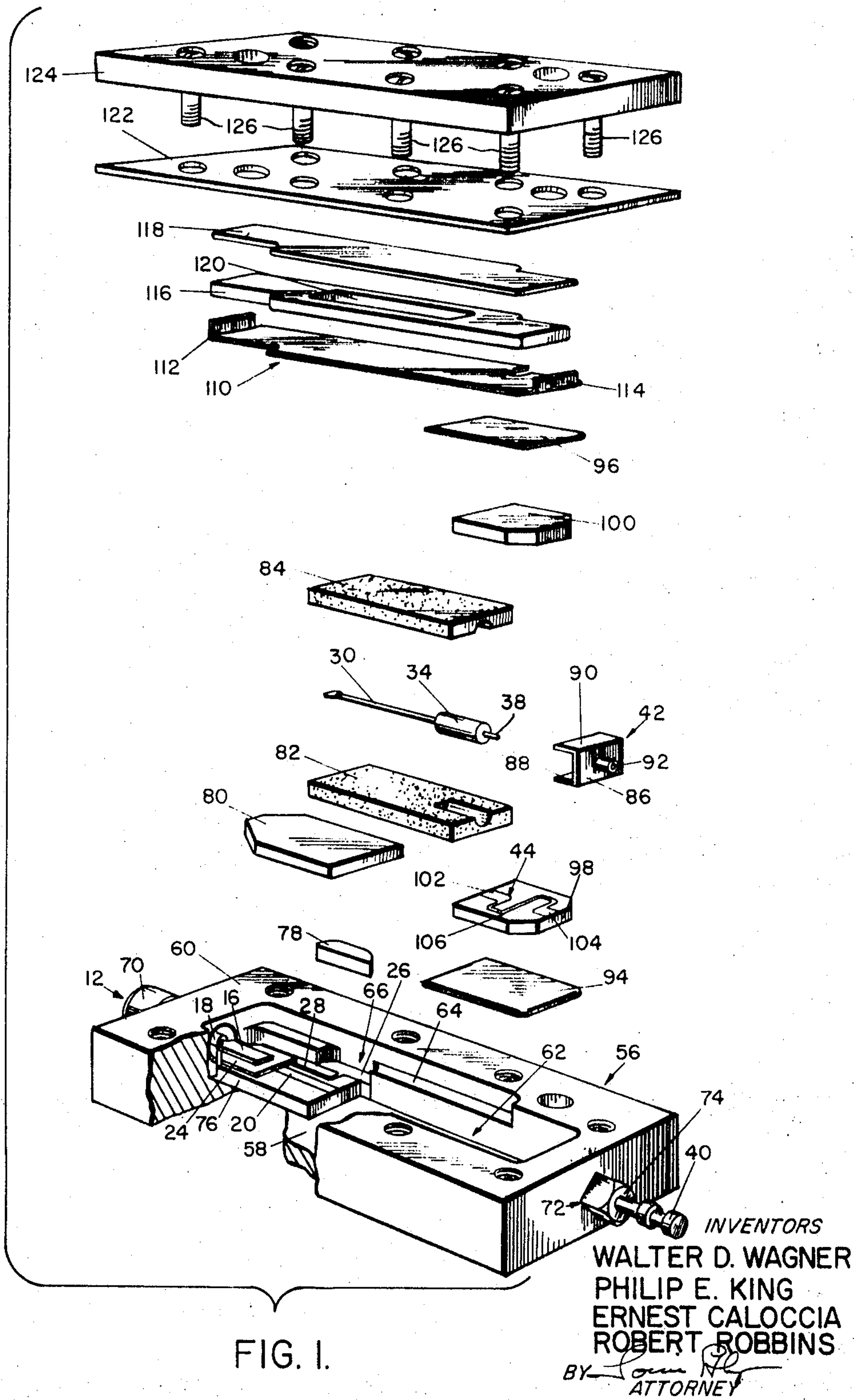
FIGURE 1 is a perspective view, partly broken away and partly exploded, of a diode detector embodying the invention.

The detailed construction of the detector will now be described with reference to FIGURES 1, 2 and 3. It includes a metal housing block 56 having an elongated platform 58 recessed below the top surface 60. Between the platform 58 and the top surface 60, the longitudinal sides of the recess 62 are stepped outwardly to form shoulders 63 and 64 (FIGURES 1 and 3). As also shown in FIGURES 1 and 3, a tab seat 66 interrupts the shoulder 64 along the high-pass filter 22.

The platform 58, and a metal sheet 110, described in detail hereinafter, form the ground plane outer conductors for the strip transmission line extending between the connector 12 and the terminal 40.

The metal sheet is disposed in the recess 62 substantially in the plane of the shoulders 63 and 64.

The coaxial connector 12 extends from one end of the housing block 56 and its inner conductor 18 is insulated from the housing block and extends into the recess 62. The connector outer conductor 70 is connected to the housing block. At the other end of the housing block 56 is a feedthrough connector 72 that has an insulating sleeve 74 supporting the terminal 40, which passes through the block from the recess 62.

For subsequent reference, the end of the recess 62 adjacent the coaxial connector 12 is referred to as the "input end" of the detector. Correspondingly, the end of the recess at the feedthrough terminal 72 is the "output end." Also, the "R.F. portion" of the detector extends from the connector 12 to the diode 34, and the "video portion" is between the diode and terminal 40. Further, the use herein of terms such as "upper," "top," "lower," and "bottom" have reference to the orientation shown in FIGURES 1 and 2.

With further reference to the drawings, and particularly to FIGURES 1 and 2, an insulating board 76, disposed in the recess 62 at the input end, has a protrusion that fits in the tab seat 66. The thickness of the insulating board 76 is substantially one-half the height of the shoulders 63 and 64 above the platform 58.

The inner conductor 20, branch conductor 28 and tab conductor 26 are formed by printed circuit techniques on the top surface of the board 76. The inner conductor 20 extends along substantially the entire length of the board 76 and is preferably soldered to the diode lead 30. As shown in FIGURES 1 and 3, the tab conductor 26 is essentially contained within the tab seat 66 to be longitudinally in line with the shoulder 64. The branch conductor 28 extends between the tab conductor and, in the illustrated embodiment, the end of the inner conductor 20 adjacent the input end of the recess 62.

Referring again to FIGURE 1, a metal tab block 78 fits in the tab seat 66 above the tab conductor 26; the top surface of the block 78 is substantially coplanar with the shoulder 64.

An insulating board 80 (FIGURES 1 and 2) identical to the board 76, except that it does not have the tab seat protrusion supporting the tab conductor 26, is in register with the board 76 above the branch conductor 28 and above the assemblage of the inner conductor 20, mica sheet 24 and inner conductor plate 16. These latter three elements are very thin, illustratively having a total thickness less than 0.02 cm., and are shown exaggerated in size in the drawings.

At the ends of the insulating boards 76 and 80 removed from the connector 12, identical foam insulators 82 and 84 fill the recess 62 to the level of the shoulders 63 and 64. The foam insulators are symmetrically cut away to receive the diode 34, which together with the leads 30 and 38, is sandwiched between the insulators.

Moving onto the output end of the detector, the channel member 42 has a web 86 (FIGURES 1 and 2) joining together two flanges 88 and 90. The member is disposed (FIGURE 2) closely adjacent the output end of the diode 34 and has a tube 92 centrally secured on the web 86 with the diode cathode lead 38 crimped therein. The flanges 88 and 90 are disposed over the outer surfaces of the foam insulators 82 and 84 so as to urge them together. The flanges are parallel to the platform 58 at the bottom of the housing block recess, and a thin insulating sheet 94 closely spaces the lower flange 88 from the platform. The sheet 94 covers the platform between the channel member and the output end of the recess, as seen in FIGURE 2. The flange 88 and the thin sheet 94 thus form part of an R.F. bypass capacitor between the diode lead 38 and the housing body 56; this capacitor is part of the low-pass filter 36.

Another thin insulating sheet 96 identical to the sheet 94 is disposed between the metal sheet 110 and the top flange 90. This forms another R.F. bypass capacitor to the transmission line outer conductor structure from the diode lead 36. This capacitor is in parallel with the capacitor between the flange 88 and the housing body 56, and also is part of the low-pass filter 36. The insulating sheet 96 also covers insulating boards 98 and 100, now to be described with further reference to FIGURE 1.

The insulating board 98 rests on the platform 58 above the insulating sheet 94 between the foam insulator 82 and the output end of the housing block 56. Its top surface, which is substantially coplanar with the top surfaces of the insulating board 76 and the foam insulator 82, carries the inner conductor 44 as a printed circuit element. This inner conductor has end tabs 102 and 104 (FIGURES 1 and 3) considerably wider than a narrow, substantially S-shaped, folded section 106 extending between the end tabs. The tube 92 on the channel member 42 overlies the end tab 102 to form a radio frequency connection between the diode cathode lead 36 and the inner conductor 44. The other end tab 104 connects to the terminal 40 of the feedthrough connector 74 by a short wire 108 (FIGURES 2 and 3) soldered to the terminal 40 and overlying the tab 104.

The insulating board 100 is substantially identical with the board 98, except that it does not carry an inner conductor. It is disposed between the board 98 and the thin upper insulating sheet 96. The upper surface of the insulating board 100 is substantially coplanar with the upper surfaces of the foam insulator 84 and the insulating board 80, as well as with the housing block shoulders 63 and 64 (FIGURE 1).

With further reference to FIGURES 1 and 2, the sheet 110 is preferably thin, compliant and highly conductive, e.g. of aluminum. It fits into the housing block recess over the insulating block 80, foam insulator 82 and insulating sheet 96. The illustrated sheet 110 has upwardly protruding end flaps 112 and 114 that contact the housing block wall at the input and output ends of the recess. Aside from these flaps, the periphery of the metal sheet conforms substantially to the periphery of the recess 62 above the shoulders. Thus, the sheet overlies the shoulders 63 and 64 and the tab block 78. The sheet is thus in good R.F. contact with the housing block substantially all around the recess 62.

A compression gasket 116, suitably of fluorinated silicone rubber, fits in the housing block recess 62 over the metal sheet 110. Its periphery substantially conforms to the recess 62 so that it extends over the shoulders 63 and 64. The uncompressed gasket protrudes above the upper surface of the housing block by the thickness of the metal sheet 110, e.g. around 0.75 millimeter. One or more insulating shims 118 can be placed above the gasket 116 to build the gasket up when desired.

As shown in FIGURES 1 and 2, the compression gasket 116 preferably has a void 120 in the central region that overlies the diode 34, the flanges 88 and 90 of channel member 42, and most of the diode lead 30. The void 120 is laterally centered over the diode and its width is somewhat less than the width of the foam insulators 82 and 84.

The detector is completed with a sealing gasket 122 covered with a metal cover plate 124 that is bolted by screws 126 to the housing block 56 outside the periphery of the recess 62. The screws are tightened sufficiently to compress the sealing gasket between the plate 124 and the housing block upper surface 60 to seal the recess 62 and the pieces therein from contamination by moisture and dirt in the environment.

When the cover plate is thus secured to the housing block, it presses the compression gasket 116 against the metal sheet 110, urging the sheet down against the housing block shoulders 64 to form a reliable and secure R.F. connection between the housing block and the sheet 110. The clamping forces the cover plate exerts on the compression gasket 116 also maintain secure and reliable R.F. contact between the tube 92 on the channel member 42 and the inner conductor tab 102, and between the inner conductor tab 104 and the wire 108 (FIGURES 2 and 3) connected to the feedthrough terminal 40.

The compression gasket 116 also presses the metal sheet 110 down against the dielectric boards 80 and 100 and against the periphery of the foam insulator 84. This securely holds in place all the constituent parts of the detector between the housing block 56 and the metal sheet 110.

The foregoing strip transmission line construction thus readily accommodates different thicknesses of inner conductor and insulating structures between the opposed outer conductors 58 and 110 at different places along the transmission line. Thus, the detector does not require constituent parts having exacting mechanical tolerances, and it therefore can be constructed at relatively low cost.

With further reference to the drawings, and particularly to FIGURE 3, the diode 34 has a large impedance relative to the 50 ohm characteristic impedance standard for most transmission line circuits, including the output impedance for the source 14 to which the detector is connected. Moreover, when the diode is mounted in a conventional transmission line diode mount, both the reactance and the resistance of the mounted diode vary widely with R.F. frequency. Indeed, as the point at which the reflection R.F. impedance of the diode is measured is moved along a transmission line toward the source of the signal being detected, this dispersion of the impedance with frequency increases. This is undesirable, for in order to obtain good electrical performance, the detector should be matched to the R.F. source 14 over the entire operating range.

The present detector transforms the comparatively high, and highly frequency-sensitive, diode input R.F. impedance to a value that is comparatively well matched to the low R.F. source impedance over a relatively wide frequency range, e.g. from 8 gHz. to 10 gHz. Particularly striking is the fact that the detector achieves this result with an essentially miniature package.

In accordance with the invention, the diode 34 is incorporated in a relatively high impedance transmission line and encapsulated in a dielectric material—the foam insulators 82 and 84—having a relatively frequency invariant dielectric constant of 1.04, which is close to the ideal unity value of free space. (By comparison, the dielectric constants of conventional printed circuits boards supporting strip line inner conductors are roughly between 2 and 5.) With this construction, the diode exhibits a measured R.F. input impedance that has considerably less variation with frequency than prior arrangements. For example, in a typical prior transmission line mount, the diode R.F impedance shifts at least ¼ way around a Smith chart when the frequency is changed over a 2:1 range. In the present transmission line structure, on the other hand, the measured R.F. input impedance of the diode-transmission line combination changes by such a small amount over the same frequency range that its excursion on a Smith chart is limited to approximately 1/25 of the chart's circumference. Notice that this result is achieved without the use of compensating reactances.

The transmission line impedance transformer 32, intermediate the diode 34 and the relatively wide inner conductor 20, transforms this R.F. impedance to a lower value that is fairly well-matched to the 50 ohm impedance of the illustrated coaxial connector 12. In particular, in the impedance transformer 32 is essentially a quarter-wave impedance transformer comprising the narrow inner conductor formed by the diode anode lead 30 and the surrounding foam insulators 82 and 84 that encase the diode. Thus, the lead 30 is roughly a quarter-wavelength long at the middle of the R.F. operating band. The exact length is preferably adjusted to minimize the standing wave ratio at the input to the impedance transformer. In the illustrated transmission line, it is slightly less than a quarter-wavelength at this midband frequency, but is considerably longer than an eighth-wavelength.

Also, by way of example, for a diode having an input impedance around 1000 ohms, we have found that a impedance transformer having a characteristic impedance around 150 ohms is satisfactory. A somewhat higher value might also be suitable, but this would require either a larger space between the outer conductors—which increases the cost and the bulk of the detector—or a smaller inner conductor diameter than the conventional lead diameter provided with present-day microwave diodes.

Turning to the high-pass filter 22 (FIGURE 3) between the connector 12 and the impedance transformer 32, prior art detectors incorporate a shunt choke to conduct applied D.C. diode bias and rectified R.F. voltage from the inner conductor to ground. Although a choke can have a very low D.C. resistance as desired, its impedance increases linearly with frequency and hence the choke presents a relatively high impedance to signals below the R.F. operating band which should not be detected by the detector. Thus, in many prior art detectors, these lower frequency signals are applied to the diode with the result that they distort the video output signal.

The present detector resolves this problem with the compact TEM mode transmission line filter 22. Simply stated, in the filter, the inductive reactance of the branch conductor 28, which provides the requisite D.C. path to ground, resonates with the capacitive reactance between the plate 16 and conductor 20 at a cutoff frequency slightly lower than the lowest radio frequency in the operating band. For this operation, the branch conductor 28 is preferably less than a quarter-wavelength long at the highest R.F. frequency of operation. In the illustrated detector, the branch conductor 28 connects to the inner conductor 20 at the plate 16. However, it can also be connected to the conductor 20 further toward the transformer 32; in that case, the length of inner conductor 20 between the plate 16 and the branch conductor 28 is preferably shorter than one-tenth of the shortest R.F. wavelength.

Above its cutoff frequency, the filter 22 presents a matched impedance to the connector 12 and has minimal attenuation between the connector and the impedance transformer 32. Below the cutoff frequency, the attenuation through the filter is considerably higher. Thus, the filter blocks direct voltages and lower R.F. noise. It shunts these unwanted voltages to ground on the branch conductor 28, which has a relatively low impedance below the filter cutoff frequency. However, above the cutoff frequency the branch conductor presents a high, essentially open circuit, impedance to the modulated R.F. power being detected.

The filter 22 has a relatively sharp transition between these blocking characteristics below the cutoff frequency and the matched characteristics developed above cutoff. Hence, it provides a fairly high degree of selection between the desired higher R.F. signals and the unwanted lower R.F. and other signals.

Moreover, its response is relatively flat in the passband above its cutoff frequency. As a result, the filter couples the selected radio frequency signals to the impedance transformer 32 with a relatively invariant and minimal attenuation over a wide band that can readily cover a 2:1 frequency range. With further reference to the filter 22, the length of the inner conductor 20 between the impedance transformer 32 and the branch conductor 28 is preferably such as to minimize the input standing wave ratio at the coaxial connector 12. More particularly, as the impedance at the input to the impedance transformer 32 is "rolled" along the inner conductor 20 toward the connector 12, the values of both the resistive and the reactive components thereof change. Optimum performance is generally attained when the branch conductor 28 connects to the conductor 20 at a point where the admittance on the conductor 20 (looking toward the impedance transformer 32) is the conjugate of the admittance the branch conductor 28 presents to the conductor 20. With this condition, the impedance of the branch conductor 28 will help to transform the impedance at the input end of inner conductor 20 to a value closer to the desired design value, i.e. 50 ohms. The detector provides this operation with no increase in cost or bulk aside from possibly adding a few additional millimeters to the length of conductor 20.

As stated above, at the output side of the detector, the diode cathode lead 38 connects to the low-pass filter 36 formed by the capacitance to ground from the flanges of channel member 42 and the series inductance of the inner conductor 44. The design of the filter 36 can be better understood by first considering its purposes, two principal ones being to isolate radio frequency currents from the output terminal 40 and to provide impedances that contribute to a short video rise time and to a high tangential signal sensitivity.

Regarding R.F. isolation, to prevent radio frequency currents from traveling to the output terminal 40, prior detectors employ an R.F. bypass capacitor from the video end of the diode to ground. However, as the bypass capacitance is increased to provide high isolation, the video rise time of the detector get longer, which is undesirable.

The present detector, on the other hand, incorporates the R.F. bypass capacitor in the low-pass filter 36 so as to provide both high R.F. isolation and a short video rise time. In particular, in the filter 36, the inductance of the inner conductor 44 resonates with the shunt capacitance between the flanged channel member 42 and the transmission line outer conductors at a cutoff frequency that is slightly above the highest video frequency of operation. This cutoff frequency is hence considerably below the R.F. cutoff frequency of the high-pass filter 22. Below its video cutoff frequency, the filter 36 has a relatively constant, low impedance to the output terminal 40 and a comparatively high impedance to ground. Thus, the video signals from the diode arrive at the output terminal 40 essentially unattenuated and with relatively close phase coherence. These impedance characteristics contribute to a short video rise time.

Above its cutoff frequency, the low-pass filter 36 presents a comparatively high series impedance to the diode cathode lead 38 and a relatively low shunt impedance to ground. The R.F. currents at the diode lead 38 are thus shunted to ground and blocked from the video output terminal.

For this operation, the thin folded section 106 of the inner conductor 44 is structured to provide the desired series inductance. By way of example, in a detector in which the channel member 42 provides a 10 pf. bypass capacitor, the inductance of the illustrated inner conductor 44 is .010 mh. at 3000 mc. The end tabs 102 and 104 of the inner conductor 44 are proportioned to make good R.F. contact with the tube 92 and the wire 108, respectively. However, the length of the inner conductor between the folded section 106 and the channel 42 should not exceed one-tenth of the shortest video wavelength of interest.

As with the other sections of the present detector, the low-pass filter 36 operates in the TEM mode and requires essentially no more space than a conventional video path to the feedthrough terminal 72.

The effectiveness of the foregoing transmission line construction in providing a miniature high performance detector is illustrated by the performance achieved with a detector constructed in this manner for operation over a 17-megacycle video bandwidth and over a 2:1 radio frequency bandwidth extending at least up to 12 gHz. The overall size of the detector, including both the R.F. input connector and the video output terminal, is approximately 2 centimeters wide, 6 centimeters long and 1.25 centimeters high. When operated with a direct current bias of 50 microamperes and with a 2000-ohm video load impedance, the minimum tangential signal sensitivity was 52 db below 1 milliwatt and the flatness was within 2 db for a dynamic range of the input R.F. power between the minimum discernible level of 55 dbm. up to 1 dbm. Moreover, the video rise time of the detector was 10 nanoseconds, and the R.F. input standing wave ratio was under 4.5. The cost of the detector was very advantageous as compared to prior art detectors designed for the same application.

The construction of the detector described above and shown in FIGURES 1, 2 and 3 can also be used as the detector stage of a mixer assembly. When the detector is used in a mixer assembly, the modulated R.F. signal and a local oscillator signal are combined by means known in the art externally of the described detector with the combined signal being applied to the input stage of the detector assembly, coaxial connector 12. The resultant I.F. signal is developed in the detector and the signal appears at the output terminal 72 of the detector. When employed in a mixer assembly, the transmission line detector circuit described above provides a low conversion loss and low noise over a wide R.F. band.

The invention this provides miniature microwave detectors and mixers having a high, essentially frequency-stable, performance. The detectors and mixers are further characterized by flat operation over a wide range of input signal levels. They are readily incorporated in a strip transmission line, although the invention also has application to detectors and mixers employing coaxial transmission line.

Further, the invention provides a strip transmission line construction that is well-suited for microwave circuits other than detectors and mixers. In particular, the use of a relatively compliant metal sheet to form one ground plane outer conductor facilitates the construction and enhances the electrical performance of many strip line devices. The metal sheet is preferably pressed toward an opposing rigidly supported outer conductor by a resilient pad or like arrangement. Further, sponge-like foam insulators supporting the inner conductor elements between the outer conductors provide both mechanical and electrical advantages in many high frequency circuits. A principal mechanical feature is that they minimize tolerance problems when different-size components and the like are to be included between the outer conductors.

It will thus be seen that the objects set forth above, among those made apparent from the preceding description, are efficiently attained; and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed as new and secured by Letters Patent is:

1. A transmission line device having an outer conductor structure spaced from an inner conductor that extends between a transmission line input port and an output port, and having a semiconductor device connected to said inner conductor, said device comprising (A) a mount section between said input and output ports in which said semiconductor device is mounted, (B) a transformer section connected to the end of said mount section closer to said input port and transforming the input impedance of said mount section toward the characteristic impedance in said input port, and (C) a high-pass filter section (1) in series between said transformer section and said input port, and (2) including (a) an inductive conductor connected between said inner conductor and said outer conductor structure, and (b) means forming a first capacitor in said inner conductor between said input port and the connection of said inductive conductor to said inner conductor, (c) said inductive conductor and said capacitor being substantially resonant with each other at a frequency below a band of frequencies to be applied from said input port to said mount section.

2. A transmission line device according to claim 1 in which the length of said inner conductor between said transformer section and the connection of said inductive conductor to said inner conductor is selected to present a minimum standing wave ratio at said input port.

3. A transmission line device according to claim 2 in which said section of said inner conductor transforms the input impedance at said transformer section toward a value that is the conjugate of the impedance said inductive conductor presents to said inner conductor.

4. A transmission line device according to claim 1 in which said transformer section is a resonant transmission line type impedance transformer.

5. A transmission line device according to claim 1 further comprising (A) a low-pass filter section (1) in series between said mount section and said output port, and (2) including (a) a second capacitor between said inner conductor and said outer conductor structure, (b) an inductive section in said inner conductor in series between the connection of said capacitor to said inner conductor and said output port, (c) said second capacitor and said inductive inner conductor section being substantially resonant with each other at a frequency above a selected passband.

6. A transmission line device according to claim 5

(A) for operation with an input signal having a first range of frequencies and (B) in which the length of said inner conductor in said high-pass filter section between said first capacitor and the connection of said inductive conductor to said inner conductor is less than one-tenth wavelength at the highest frequency in said first range.

7. A strip transmission line device (i) having a pair of opposed outer conductors spaced from an inner conductor that extends between an input transmission line port and an output port, (ii) having a semiconductor diode in series in said inner conductor, (iii) arranged to operate with an input signal having a first range of frequencies, and (iv) arranged to develop an output signal having a second range of frequencies below said first range, said device comprising (A) a mount section in which said diode is disposed, (B) a impedance transforming section connected to the end of said mount section closer to said input port and having an inner conductor that is substantially a quarter-wavelength long at a frequency near the middle of said first range and having an impedance that is intermediate the input impedance of said mount section and the impedance in said input port, (C) a ribbon-like inner conductor in series between said first impedance transforming section and said input port and developing with said outer conductors an impedance substantially equal to the impedance in said input port, (D) a thin insulating layer over the end portion of said ribbon-like inner conductor closer to said input port, (E) a flat inner conductor connected to the inner conductor of said input port and overlying said insulating layer to form a series capacitor with said end portion of said ribbon-like inner conductor, (F) an inductive conductor, having an electrical length of less than a quarter-wavelength at the highest frequency in said first range, connected between said ribbon-like inner conductor and said outer conductors at a point less than one-tenth wavelength from said end portion of the ribbon-like inner conductor at the highest frequency of said first range, (G) a section of said inner conductor between said mount and said output port developing a relatively high inductance at said first range of frequencies, and (H) a capacitive member (1) connected to said inner conductor intermediate said mount section and said inductive inner conductor section, and (2) having planar portions closely spaced and insulated from said outer conductors and forming capacitors therewith at said first range of frequencies.

8. A strip transmission line device according to claim 7 wherein said sections are arranged to operate in the TEM mode with signals in said first frequency range.

References Cited

UNITED STATES PATENTS

| | | | |
|---|---|---|---|
| 3,209,291 | 9/1965 | Schneider. | |
| 3,246,265 | 4/1966 | Smith-Vaniz. | |
| 3,310,747 | 3/1967 | Anderson | 325—445 |
| 3,358,214 | 12/1967 | Schwarzmann | 321—69 |
| 3,292,075 | 12/1966 | Wenzel. | |

ALFRED L. BRODY, Primary Examiner

U.S. Cl. X.R.

307—233, 314; 325—445; 329—116; 333—84